(12) United States Patent
Gray et al.

(10) Patent No.: US 8,563,844 B2
(45) Date of Patent: Oct. 22, 2013

(54) THIN-FILM HETEROSTRUCTURE THERMOELECTRICS IN A GROUP IIA AND IV-VI MATERIALS SYSTEM

(75) Inventors: Allen L. Gray, Holly Springs, NC (US); Robert Joseph Therrien, Cary, NC (US); Patrick John McCann, Norman, OK (US)

(73) Assignees: Phononic Devices, Inc., Durham, NC (US); Board of Regents of the University of Oklahoma, Norman, OK (US)

( * ) Notice: Subject to any disclaimer, the term of this patent is extended or adjusted under 35 U.S.C. 154(b) by 0 days.

(21) Appl. No.: 13/416,246

(22) Filed: Mar. 9, 2012

(65) Prior Publication Data
US 2012/0216848 A1 Aug. 30, 2012

Related U.S. Application Data

(63) Continuation of application No. 13/404,548, filed on Feb. 24, 2012.

(60) Provisional application No. 61/447,459, filed on Feb. 28, 2011.

(51) Int. Cl.
*H01L 35/26* (2006.01)
*H01L 35/22* (2006.01)

(52) U.S. Cl.
USPC ........ 136/238; 136/200; 136/201; 136/236.1; 136/237; 136/239; 136/240; 257/22; 257/42; 257/108; 257/442; 257/467; 257/468; 257/469; 257/470; 257/614; 257/930

(58) Field of Classification Search
USPC ............. 136/200, 201, 237, 236.1, 239, 240; 257/22, 42, 108, 442, 467, 468, 469, 257/470, 614, 930
See application file for complete search history.

(56) References Cited

U.S. PATENT DOCUMENTS

| 5,682,041 A | 10/1997 | Kawakubo et al. |
| 5,900,071 A * | 5/1999 | Harman ............ 136/236.1 |
| 2002/0177248 A1* | 11/2002 | McCann et al. ............ 438/22 |

FOREIGN PATENT DOCUMENTS

EP 2166574 A1 3/2010

OTHER PUBLICATIONS

Mukherjee et al., "Lead salt thin film semiconductors for microelectric applications", 2010.*
International Search Report for PCT/US2012/026511 mailed Jun. 29, 2012, 9 pages.
Heremans, J. P. et al., "Enhancement of Thermoelectric Efficiency in PbTe by Distortion of the Electronic Density of States," Science, vol. 321, Jul. 25, 2008, pp. 554-557.
Hicks, L. D. et al., "Effect of Quantum-Well Structures on the Thermoelectric Figure of Merit," Physical Review B, vol. 47, No. 19, May 15, 1993, pp. 12,727-12,731.

(Continued)

*Primary Examiner* — Jennifer Michener
*Assistant Examiner* — Matthew Martin
(74) *Attorney, Agent, or Firm* — Withrow & Terranova, PLLC

(57) ABSTRACT

Embodiments of a thin-film heterostructure thermoelectric material and methods of fabrication thereof are disclosed. In general, the thermoelectric material is formed in a Group IIa and IV-VI materials system. The thermoelectric material includes an epitaxial heterostructure and exhibits high heat pumping and figure-of-merit performance in terms of Seebeck coefficient, electrical conductivity, and thermal conductivity over broad temperature ranges through appropriate engineering and judicious optimization of the epitaxial heterostructure.

15 Claims, 6 Drawing Sheets

(56) References Cited

OTHER PUBLICATIONS

Restriction Requirement for U.S. Appl. No. 13/404,548, mailed Jun. 13, 2013, 8 pages.

Non-Final Office Action for U.S. Appl. No. 13/404,548, mailed Aug. 29, 2013, 18 pages.

* cited by examiner

THIN-FILM HETEROSTRUCTURE THERMOELECTRICS IN A GROUP IIA AND IV-VI MATERIALS SYSTEM

RELATED APPLICATIONS

This application is a Continuation of U.S. patent application Ser. No. 13/404,548, entitled THIN-FILM HETEROSTRUCTURE THERMOELECTRICS IN A GROUP IIA AND IV-VI MATERIALS SYSTEM, filed on Feb. 24, 2012, which claims the benefit of provisional patent application Ser. No. 61/447,459, filed Feb. 28, 2011, the disclosures of which are hereby incorporated herein by reference in their entireties.

GOVERNMENT SUPPORT

This invention was made with government funds under contract number AR0000033 awarded by ARPA-E. The U.S. Government may have rights in this invention.

FIELD OF THE DISCLOSURE

The present disclosure relates to thermoelectric materials.

BACKGROUND

In recent years, an increasing concern of global energy usage and its impact on the environment, in particular global warming, has resulted in extensive research into novel technologies of generating electrical power. Thermoelectric power generators have emerged as a promising alternative green technology due to their distinct advantages. In general, thermoelectric power generators offer a potential application in the direct conversion of waste-heat energy into electrical power irrespective of the cost of the thermal energy input.

A thermoelectric device can be used as a thermoelectric power generator or a thermoelectric cooler. Applications of these devices range from, for example, electronic thermal management and solid state refrigeration to power generation from waste heat sources. A thermoelectric generator is a solid state device that provides direct energy conversion from thermal energy (heat) due to a temperature gradient into electrical energy based on a so-called "Seebeck effect." The thermoelectric power cycle, with charge carriers (electrons) serving as the working fluid, follows the fundamental laws of thermodynamics and intimately resembles the power cycle of a conventional heat engine. Thermoelectric power generators offer several distinct advantages over other technologies including, for example, high reliability, small footprint but with potential scaling to meet large area applications, lightweight, flexibility, and non-position dependency.

A major challenge of thermoelectric devices is their relatively low conversion efficiency, which is typically ~5%. This has been a major cause in restricting their use in electrical power generation and thermal management to specialized fields where space and reliability are a premium.

The figure-of-merit (ZT) of a thermoelectric material is a dimensionless unit that is used to compare the efficiencies of various materials. ZT is determined by three physical parameters: the thermopower $a$ (also known as a Seebeck coefficient), electrical conductivity $a$, and thermal conductivity $k = k_e + k_{ph}$, where the $k_e$ and $k_{ph}$ are thermal conductivities of electrons and phonons, respectively; and absolute temperature T:

$$ZT = \frac{\alpha^2 \sigma}{(k_e + k_{ph})} T.$$

Maximum ZT in bulk thermoelectric materials is governed by the intrinsic properties of the material system. Most candidates require low thermal conductivity as the driving force for enhanced ZT because of the inverse relationship between the Seebeck coefficient and electrical conductivity. This interdependence and coupling between the Seebeck coefficient and the electrical conductivity makes it difficult to increase ZT>1, despite nearly five decades of research. Increasing this value to 2.0 or higher will disrupt existing technologies and will ultimately enable more widespread use of thermoelectric systems.

In L. D. Hicks and M. S. Dresselhaus, *Effect of quantum-well structures on the thermoelectric figure of merit, Phys. Rev. B*, Vol. 47, No. 19, 12727-12731 (May 15, 1993), Hicks and Dresselhaus pioneered the concept of quantum confined structures that could significantly increase ZT by independently optimizing the Seebeck coefficient and electrical conductivity. Since then, numerous research groups have adopted nano-structured approaches to increase ZT and have ultimately determined that the enhancement resulted from reduced thermal conductivity from phonon scattering at the interfaces. In J. P. Heremans, V. Jovovic, E. S. Toberer, A. Saramat, K. Kurosaki, A. Charoenphakdee, S. Yamanaka, and G. J. Snyder, *Enhancement of Thermoelectric Efficiency in PbTe by Distortion of the Electronic Density of States, Science*, Vol. 321, 554-557 (Jul. 25, 2008), Heremans showed a significant improvement in the Seebeck coefficient by distortion of the electronic density of states through the use of impurity levels.

An alternative approach recently investigated to enhance thermoelectric performance using nano-structured materials is hot carrier transport via thermionic emission. The design criteria require a potential barrier of several $k_B T$ (where k is Boltzman constant, and T is temperature) to selectively transport high-energy "hot" carriers. The distribution of hot carriers at energy greater than the barrier height with respect to the Fermi level defines the Seebeck coefficient and the integral of this distribution defines the conductivity. Enhancement of the Seebeck coefficient has been observed by hot carrier transport for several material systems. This enhancement will be offset to some extent by a decrease in the electrical conductivity since fewer carriers are participating in transport. Thus, the overall impact on ZT will be highly dependent on the material system.

There is a need for a nano-structured thermoelectric material formed in a material system that maximizes, or at least significantly improves, ZT through hot carrier transport via thermonic emission.

SUMMARY

Embodiments of a thin-film heterostructure thermoelectric material and methods of fabrication thereof are disclosed. In general, the thermoelectric material is formed in a Group IIa and IV-VI materials system. The thermoelectric material includes an epitaxial heterostructure and exhibits high heat pumping and figure-of-merit performance in terms of Seebeck coefficient, electrical conductivity, and thermal conductivity over broad temperature ranges through appropriate engineering and judicious optimization of the epitaxial heterostructure.

The epitaxial heterostructure forms one or more potential barriers that assist carrier heat transport by thermonic emission. More specifically, in one embodiment, the epitaxial heterostructure formed in a Group IIa and IV-VI materials system and includes a first well layer, a barrier layer on a surface of the first well layer, and a second well layer on a surface of the barrier layer opposite the first well layer, where at least one of the first well layer, the barrier layer, and the second well layer includes a Group IIa and IV-VI material. A bandgap of the barrier layer is greater than a bandgap of each of the first and second well layers.

In another embodiment, the epitaxial heterostructure includes multiple barrier layers separated by multiple well layers. A bandgap of each well layer is less than a bandgap of all adjacent barrier layers in the epitaxial heterostructure. The well layers and the barrier layers in the epitaxial heterostructure are all formed in a Group IIa and IV-VI materials system.

In one embodiment, each of the multiple barrier layers includes one or more layers of a first material in a Group IIa and IV-VI materials system and each of the multiple well layers includes one or more layers of a second material in the Group IIa and IV-VI materials system, where a bandgap of each barrier layer is greater than a bandgap of all adjacent well layers in the epitaxial heterostructure. In one particular embodiment, each barrier layer includes one or more layers of $Pb_{(1-x-y)}Sr_xSn_ySe$ ($0<x<1$; $0<y<1$) material, and each well layer includes one or more layers of $Pb_{(1-a-b)}Sr_aSn_bSe$ ($0<a<1$; $0<b<1$) material, where a bandgap of the $Pb_{(1-x-y)}Sr_xSn_ySe$ ($0<x<1$; $0<y<1$) material is greater than a bandgap of the $Pb_{(1-a-b)}Sr_aSn_bSe$ ($0<a<1$; $0<b<1$) material.

In another embodiment, at least one of the multiple barrier layers in the epitaxial heterostructure is a short period superlattice. The superlattice includes a number of superlattice barrier layers separated by superlattice well layers, where an effective bandgap of the superlattice is greater than a bandgap of all adjacent well layers in the epitaxial heterostructure. In one particular embodiment, the superlattice barrier layers are $Pb_{(1-x-y)}Sr_xSn_ySe$ ($0<x<1$; $0<y<1$) material layers, and the superlattice well layers are $Pb_{(1-x'-y')}Sr_{x'}Sn_{y'}Se$ ($0<x'<1$; $0<y'<1$) material layers, where a bandgap of each $Pb_{(1-x'-y')}Sr_{x'}Sn_{y'}Se$ material layer is greater than a bandgap of all adjacent $Pb_{(1-x-y)}Sr_xSn_ySe$ material layers. A period thickness of the superlattice is less than a tunneling probability length at a given operating temperature in order to scatter phonons at interfaces between superlattice barrier layers and superlattice well layers in the superlattice. Furthermore, in another embodiment, thicknesses of the superlattice barrier layers and the superlattice well layers in the superlattice are varied to create an energy grading across the superlattice to increase cross-plane effective carrier density transport.

In yet another embodiment, at least one of the well layers in the epitaxial heterostructure is a short period superlattice. The superlattice includes a number of superlattice barrier layers separated by superlattice well layers, where an effective bandgap of the superlattice is less than a bandgap of all adjacent barrier layers in the epitaxial heterostructure. In one particular embodiment, the superlattice well layers are $Pb_{(1-a-b)}Sr_aSn_bSe$ ($0<a<1$; $0<b<1$) material layers, and the superlattice barrier layers are $Pb_{(1-a'-b')}Sr_{a'}Sn_{b'}Se$ ($0<a'<1$; $0<b'<1$) material layers, where a bandgap of each $Pb_{(1-a'-b')}Sr_{a'}Sn_{b'}Se$ material layer is greater than a bandgap of all adjacent $Pb_{(1-a-b)}Sr_aSn_bSe$ material layers. A period thickness of the superlattice is less than a tunneling probability length at a given operating temperature in order to scatter phonons at interfaces between the superlattice barrier layers and the superlattice well layers in the superlattice. Furthermore, in another embodiment, thicknesses of the superlattice barrier layers and the superlattice well layers in the superlattice are varied to create an energy grading across the superlattice to increase cross-plane effective carrier density transport.

In yet another embodiment, at least one of the barrier layers in the epitaxial heterostructure is a short period superlattice and at least one of the well layers in the epitaxial heterostructure is a short period superlattice.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 9:
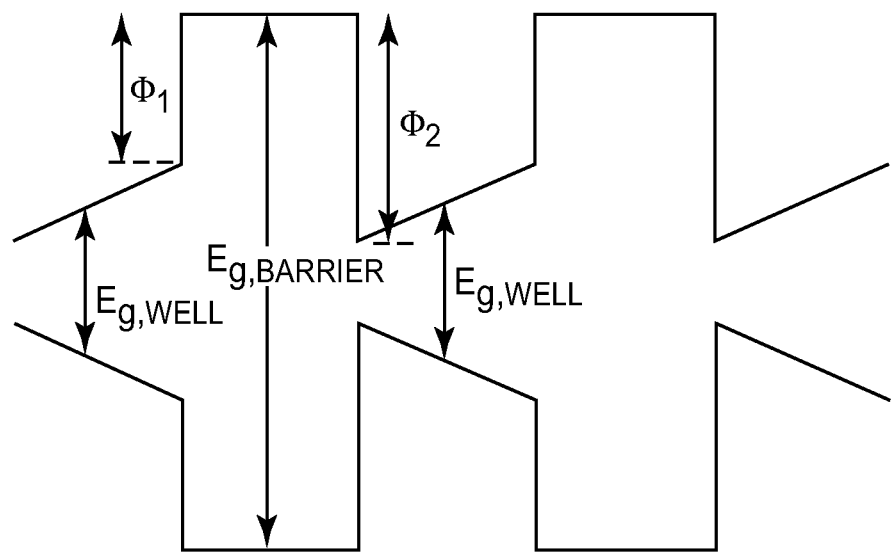
Figure 10:
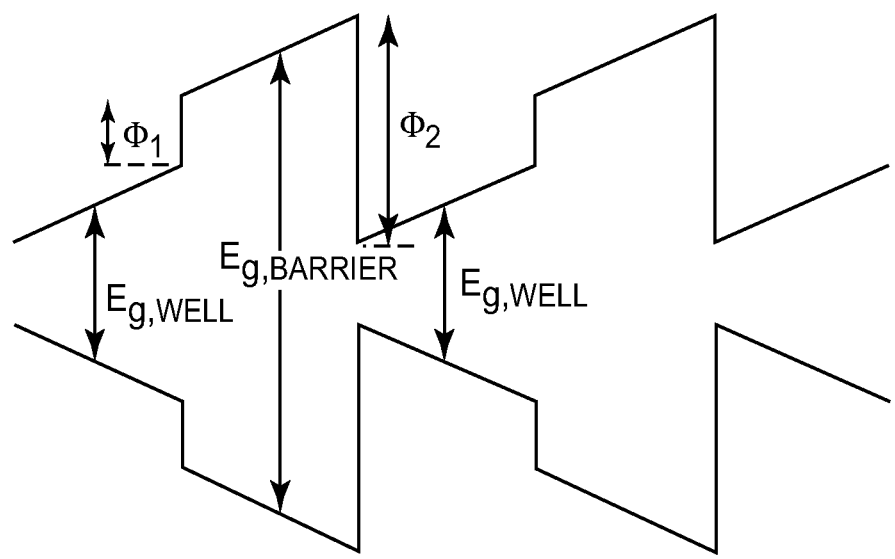

FIG. 9 is an energy band diagram for a barrier layer and adjacent well layers according to one exemplary embodiment where the well layers are formed by short period superlattices that create increasing energy gradings to increase cross-plane effective carrier density transport; and FIG. 10 is an energy band diagram for a barrier layer and adjacent well layers according to one exemplary embodiment where the barrier layer and the well layers are formed by short period superlattices that create increasing energy gradings to increase cross-plane effective carrier density transport.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The generation of high heat pumping capacity and high conversion efficiency from semiconductor thin-film thermoelectrics is very attractive owing to the compact and efficient properties of these devices. Applications of these devices range from, for example, electronic semiconductor chip cooling, solid state refrigeration, to power generation from waste heat sources. There have been many advances in thin-film thermoelectrics over the past few years, with many researchers concentrating on device fabrication, device physics, and systems applications.

Figure 1:
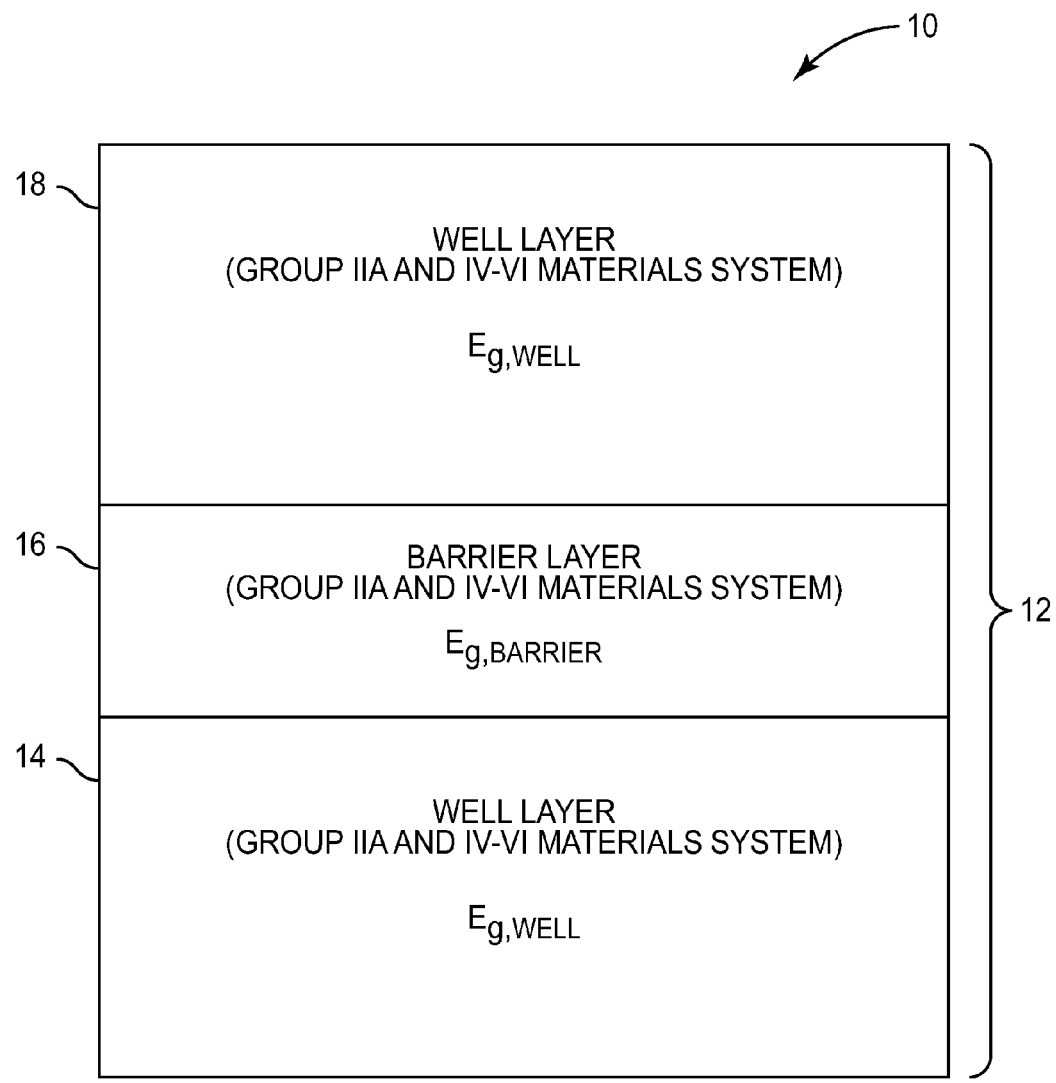
FIG. 1 illustrates a thin-film thermoelectric material having an epitaxial heterostructure including a well layer and a barrier layer according to one embodiment of the present disclosure.

FIG. 1 illustrates a thin-film thermoelectric material 10 (hereinafter "thermoelectric material 10") according to one embodiment of the present disclosure. In general, the thermoelectric material 10 is formed in a Group IIa and IV-VI materials system. As used herein, the "Group IIa and IV-VI materials system" is a system of Group IIa materials, Group IV-VI materials, and Group IIa and IV-VI materials. In one preferred embodiment, the Group IIa and IV-VI materials system is defined as $Pb_{(1-x-y)}Sr_xSn_ySe$ ($0<x<1$; $0<y<1$) materials, where x and y denote the relative mole fraction of the atomic species. In contrast, a Group IIa material is a material that includes only Group IIa elements (e.g., Strontium), a Group IV-VI material is a material that includes only Group IV and Group VI elements (e.g., PbSe), and Group IIa and IV-VI materials are materials that include Group IIa, IV, and VI elements (e.g., PbSrSe).

As illustrated, the thermoelectric material 10 includes a heterostructure 12 formed in the Group IIa and IV-VI materials system. The heterostructure 12 includes a well layer 14, a barrier layer 16 on a surface of the well layer 14, and another well layer 18 on a surface of the barrier layer 16 opposite the well layer 14. The well layer 14, the barrier layer 16, and the well layer 18 are formed in the Group IIa and IV-VI materials system, and at least one, and potentially all, of the well layer 14, the barrier layer 16, and the well layer 18 includes a Group IIa and IV-VI material. Notably, the well layers 14 and 18 may or may not be formed of the same low bandgap material. The heterostructure 12 may be formed using any suitable epitaxial growth process.

In general, a bandgap of the barrier layer 16 is greater than bandgaps of the well layers 14 and 18, which are referred to herein as adjacent well layers of the barrier layer 16. It should be noted that, when referring to the well layers 14 and 18 and the barrier layer 16, a "high bandgap" material of the barrier layer 16 is a material in the Group IIa and IV-VI materials system having a bandgap that is greater than a bandgap of a "low bandgap" material in the Group IIa and IV-VI materials system of the adjacent well layers 14 and 18. Likewise, the "low bandgap" material of the well layers 14 and 18 is a material in the Group IIa and IV-VI materials system having a bandgap that is less than a bandgap of the "high bandgap" material in the Group IIa and IV-VI materials system of the adjacent barrier layer 16.

In one embodiment, the well layer 14 is formed by one or more layers of the same low bandgap material in the Group IIa and IV-VI materials system. The barrier layer 16 is formed by one or more layers of the same high bandgap material in the Group IIa and IV-VI materials system. Lastly, the well layer 18 is formed by one or more layers of the same low bandgap material in the Group IIa and IV-VI materials system. Again, the low bandgap material used for the well layer 14 may be the same as or different than the low bandgap material used for the well layer 18.

As described below in detail, in another embodiment, the barrier layer 16 is a short period superlattice having a number of alternating high bandgap and low bandgap layers formed in the Group IIa and IV-VI materials system that together provide a desired effective, or combined, bandgap for the barrier layer 16. Note that, when referring to the superlattice, "high bandgap" material layers are material layers formed in the Group IIa and IV-VI materials system having bandgaps that are greater than adjacent "low bandgap" material layers in the superlattice, and the "low bandgap" material layers are material layers formed in the Group IIa and IV-VI materials system having bandgaps that are less than bandgaps of adjacent "high bandgap" material layers in the superlattice. A period thickness of the superlattice is less than a tunneling probability length at a given operating temperature in order to scatter phonons at interfaces between the alternating high bandgap and low bandgap material layers in the superlattice.

Furthermore, as also discussed below, thicknesses of the high bandgap and low bandgap material layers in the superlattice may be varied to create an energy grading across the superlattice to increase cross-plane effective carrier density transport.

Like the barrier layer 16, the well layer 14 may be a short period superlattice having a number of alternating high bandgap and low bandgap material layers formed in the Group IIa and IV-VI materials system that together provide a desired effective bandgap for the well layer 14. Again note that, when referring to the superlattice, "high bandgap" material layers are material layers formed in the Group IIa and IV-VI materials system having bandgaps that are greater than bandgaps of adjacent "low bandgap" material layers in the superlattice, and the "low bandgap" material layers are material layers formed in the Group IIa and IV-VI materials system having bandgaps that are less than bandgaps of adjacent "high bandgap" material layers in the superlattice. A period thickness of the superlattice is less than a tunneling probability length at a given operating temperature in order to scatter phonons at interfaces between the alternating high bandgap and low bandgap material layers in the superlattice. Furthermore, as also discussed below, thicknesses of the high bandgap and low bandgap material layers in the superlattice may be varied to create an energy grading across the well layer 14 to increase cross-plane effective carrier density transport. In a similar manner, the well layer 18 may be a short period superlattice. Note that, depending on the particular implementation, the well layer 14, the barrier layer 16, and/or the well layer 18 may be implemented as a superlattice.

In one preferred embodiment, the barrier layer 16 is or at least includes a high bandgap $Pb_{(1-x-y)}Sr_xSn_ySe$ ($0<x<1$; $0<y<1$) material, where x and y denote the relative mole fraction of the atomic species, and the well layers 14 and 18 are or include a low bandgap $Pb_{(1-a-b)}Sr_aSn_bSe$ ($0<a<1$; $0<b<1$) material, where a and b denote the relative mole fraction of the atomic species. The bandgap of the high bandgap $Pb_{(1-x-y)}Sr_xSn_ySe$ material of the barrier layer 16 is greater than the bandgap of the low bandgap $Pb_{(1-a-b)}Sr_aSn_bSe$ material of the adjacent well layers 14 and 18.

The high bandgap $Pb_{(1-x-y)}Sr_xSn_ySe$ ($0<x<1$; $0<y<1$) material is a semiconductor material and is doped either n-type or p-type. In one embodiment, a doping concentration of the high bandgap $Pb_{(1-x-y)}Sr_xSn_ySe$ ($0<x<1$; $0<y<1$) material is in the range of and including $1\times10^{17}$ and $5\times10^{19}$ dopants per cubic centimeters ($cm^3$) and has a bandgap of $E_{g1}$. In another embodiment, the doping concentration of the high bandgap $Pb_{(1-x-y)}Sr_xSn_ySe$ ($0<x<1$; $0<y<1$) material is in the range of and including $1 \times 10^{18}$ and $1 \times 10^{19}$ dopants per cm$^3$ and has a bandgap of $E_{g1}$. Similarly, the low bandgap $Pb_{(1-a-b)}Sr_aSn_bSe$ (0<a<1; 0<b<1) material is a semiconductor material and is doped either n-type or p-type. In one embodiment, a doping concentration of the low bandgap $Pb_{(1-a-b)}Sr_aSn_bSe$ (0<a<1; 0<b<1) material is in the range of and including $1 \times 10^{17}$ and $5 \times 10^{19}$ dopants per cm$^3$ and has a bandgap $E_{g2}$ that is less than $E_{g1}$. In another embodiment, the doping concentration of the low bandgap $Pb_{(1-a-b)}Sr_aSn_bSe$ (0<a<1; 0<b<1) material is in the range of and including $1 \times 10^{18}$ and $1 \times 10^{19}$ dopants per cm$^3$ and has a bandgap of $E_{g2}$ that is less than $E_{g1}$.

In one embodiment, the barrier layer 16 is formed by one or more layers of the same high bandgap $Pb_{(1-x-y)}Sr_xSn_ySe$ (0<x<1; 0<y<1) material. In another embodiment, the barrier layer 16 is comprised of a film of varying stoichiometry to engineer the conduction and valence band profiles. More specifically, the barrier layer 16 may include multiple layers of alternating high bandgap $Pb_{(1-x-y)}Sr_xSn_ySe$ (0<x<1; 0<y<1) material and low bandgap $Pb_{(1-x'-y')}Sr_x'Sn_y'Se$ (0<x'<1; 0<y'<1) material forming a short period superlattice, as described below in detail.

Similarly, in one embodiment, the well layer 14 is formed by one or more layers of the same low bandgap $Pb_{(1-a-b)}Sr_aSn_bSe$ (0<a<1; 0<b<1) material. In another embodiment, the well layer 14 is comprised of a film of varying stoichiometry to engineer the conduction and valence band profiles. More specifically, the well layer 14 may include multiple layers of alternating low bandgap $Pb_{(1-a-b)}Sr_aSn_bSe$ (0<a<1; 0<b<1) material and high bandgap $Pb_{(1-a'-b')}Sr_a'Sn_b'Se$ (0<a'<1; 0<b'<1) material forming a short period superlattice, as described below in detail. Likewise, in one embodiment, the well layer 18 is formed by one or more layers of the same low bandgap $Pb_{(1-a-b)}Sr_aSn_bSe$ (0<a<1; 0<b<1) material. In another embodiment, the well layer 18 is comprised of a film of varying stoichiometry to engineer the conduction and valence band profiles. More specifically, the well layer 18 may include multiple layers of alternating low bandgap $Pb_{(1-a-b)}Sr_aSn_bSe$ (0<a<1; 0<b<1) material and high bandgap $Pb_{(1-a'-b')}Sr_a'Sn_b'Se$ (0<a'<1; 0<b'<1) material forming a short period superlattice, as described below in detail.

The heterostructure 12 formed in the Group IIa and IV-VI materials system provides improved figure-of-merit (ZT) values over similar heterostructures formed in conventional material systems. This is due to both increasing the Seebeck coefficient and decreasing the thermal conductivity. Depending on the material system compared to, the heterostructure 12 provides a 2x to 10x improvement in the ZT value and possibly more. Note that while $Pb_{(1-x-y)}Sr_xSn_ySe$ (0<x<1; 0<y<1) and $Pb_{(1-a-b)}Sr_aSn_bSe$ (0<a<1; 0<b<1) materials are referred to above, other materials in the Group IIa and IV-VI materials system may be used for the well and barrier layers 14 through 18 in the heterostructure 12. For example, in one alternative embodiment, the barrier layer 16 is or includes PbSrSe, and the well layers 14 and 18 are or include PbSe. In another embodiment, barrier layer 16 is or includes PbSe and the well layers 14 and 18 are or include PbSnSe. In all embodiments, a thickness of the barrier layer 16 must be larger than the tunneling probability length at a given operating temperature. The tunneling probability length is defined as:

$$L_{tunnel} = \frac{h}{4\pi k_B T}\sqrt{\frac{q\phi}{m^*}},$$ (Eqn. 1)

where $L_{tunnel}$ is the minimum thickness, m* is the effective mass of the barrier material, q is the electron charge (1.6× $10^{-19}$ C), $\phi$ is the barrier height in volts (V), $k_B$ is Boltzmann's constant, T is temperature in Kelvin, and h is Planck's constant.

Lead-chalcogenide materials, such as $Pb_{(1-x-y)}Sr_xSn_ySe$ (0<x<1; 0<y<1) and $Pb_{(1-a-b)}Sr_aSn_bSe$ (0<a<1; 0<b<1) have intrinsically low thermal conductivity, high carrier n and p-type mobility, and a wide bandgap tuning range, compared to other material systems. Further, Group IV-VI materials crystallize in the rock-salt structure, in contrast to tetrahedrally-coordinated Group IV semiconductors like diamond, silicon, germanium and the Group III-V (GaAs, InAs, AlAs, GaP, etc.) or Group II-VI semiconductors (CdTe, ZnTe, etc.). As a result, many physical and electronic properties of the Group IIa and IV-VI materials system described herein differ from that of the tetrahedrally-bonded semiconductors. Also, the lead-salt compounds are mechanically much softer than their tetrahedrally-bonded counterparts resulting in higher tolerance to lattice strain and thermal expansion mismatch.

Figure 2:
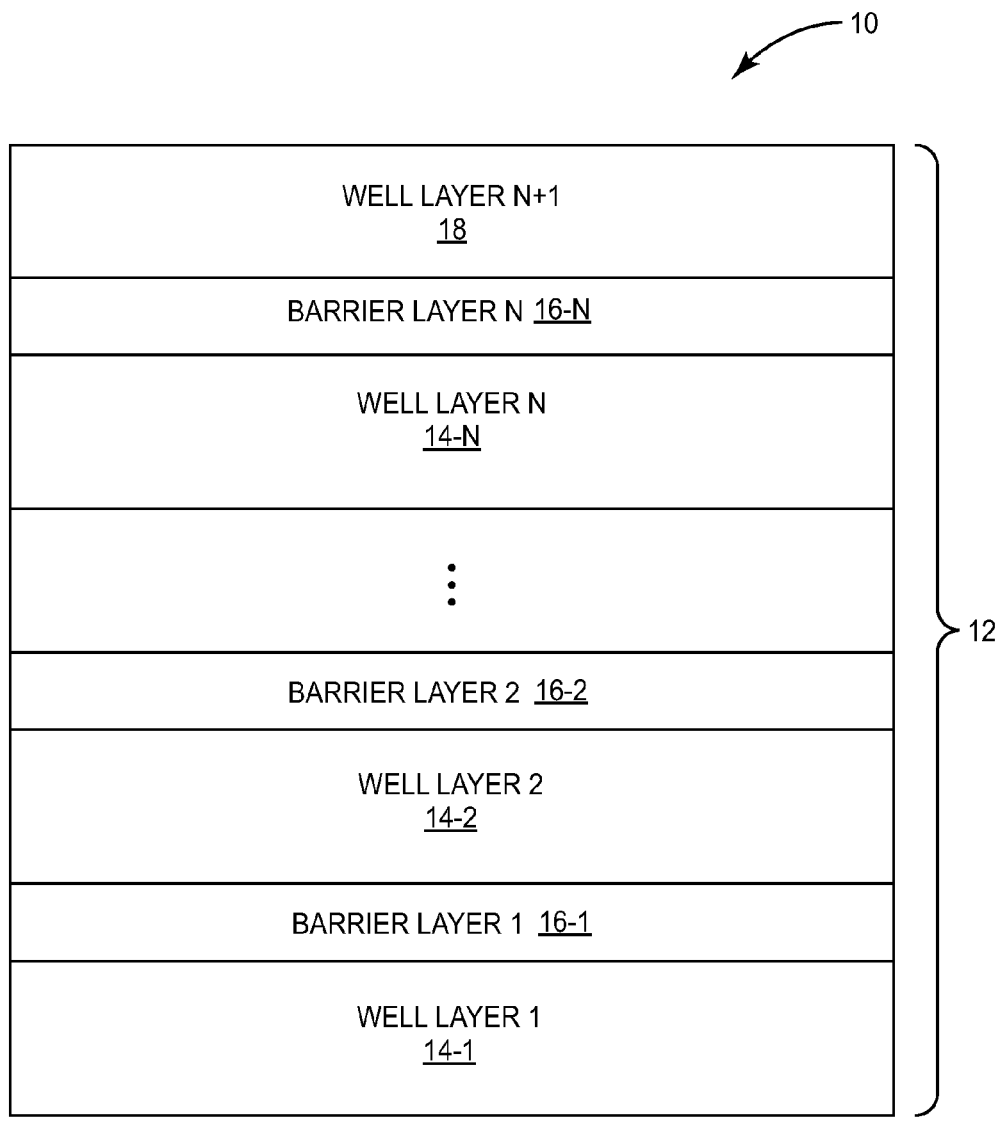
FIG. 2 illustrates a thin-film thermoelectric material having an epitaxial heterostructure including multiple barrier layers separated by well layers according to another embodiment of the present disclosure.

FIG. 2 illustrates the thermoelectric material 10 according to another embodiment of the present disclosure. In this embodiment, rather than having one barrier layer 16, the heterostructure 12 includes a number of barrier layers 16-1 through 16-N separated by corresponding well layers 14-1 through 14-N. The heterostructure 12 is terminated at both ends by well layers, namely, the well layer 14-1 and the well layer 18. The number (N) is an integer greater than or equal to 1. For example, the number (N) may be an integer in a range of and including 1 to 1000, but is not limited thereto. The heterostructure 12 of FIG. 2 increases the Seebeck coefficient through thermonic emission, and decreases the thermal conductivity through interface scattering at the interfaces between the well layers 14-1 through 14-N and 18 and the adjacent barrier layers 16-1 through 16-N.

As discussed above with respect to the barrier layer 16, the barrier layers 16-1 through 16-N are or include a high bandgap material in the Group IIa and IV-VI materials system. In one embodiment, each of the barrier layers 16-1 through 16-N is formed by one or more layers of the same high bandgap $Pb_{(1-x-y)}Sr_xSn_ySe$ (0<x<1; 0<y<1) material. In another embodiment, at least one of the barrier layers 16-1 through 16-N, and potentially all of the barrier layers 16-1 through 16-N, is comprised of a film of varying stoichiometry to engineer the conduction and valence band profiles. More specifically, at least one of the barrier layers 16-1 through 16-N may be a short period superlattice including multiple layers of alternating high bandgap $Pb_{(1-x-y)}Sr_xSn_ySe$ (0<x<1; 0<y<1) material and low bandgap $Pb_{(1-x'-y')}Sr_x'Sn_y'Se$ (0<x'<1; 0<y'<1) material, as described below in detail.

Similarly, in one embodiment, the well layers 14-1 through 14-N are or include a low bandgap material in the Group IIa and IV-VI materials system. In one embodiment, each of the well layers 14-1 through 14-N is formed by one or more layers of the same low bandgap $Pb_{(1-a-b)}Sr_aSn_bSe$ (0<a<1; 0<b<1) material. In another embodiment, at least one of the well layers 14-1 through 14-N, and potentially all of the well layers 14-1 through 14-N, is comprised of a film of varying stoichiometry to engineer the conduction and valence band profiles. More specifically, at least one of the well layers 14-1 through 14-N may be a superlattice including multiple layers of alternating low bandgap $Pb_{(1-a-b)}Sr_aSn_bSe$ (0<a<1; 0<b<1) material and high bandgap $Pb_{(1-a'-b')}Sr_a'Sn_b'Se$ (0<a'<1; 0<b'<1) material, as described below in detail.

Figure 3:
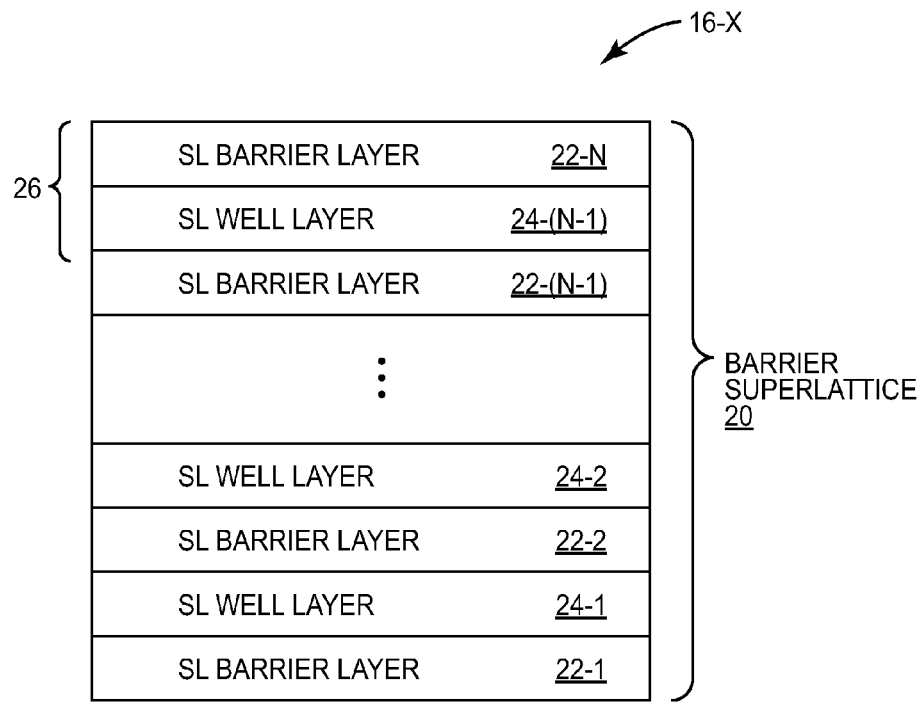
FIG. 3 illustrates an embodiment of a barrier layer for the thermoelectric material of FIGS. 1 and 2 where the barrier layer includes a short period superlattice according to one embodiment of the present disclosure.

FIG. 3 illustrates one of the barrier layers 16-1 through 16-N of FIG. 2 (hereinafter referred to as barrier layer 16-X), where the barrier layer 16-X is a short period superlattice 20 according to one embodiment of the present disclosure. Note that this discussion is equally applicable to the barrier layer 16 of FIG. 1. For convenience, the superlattice 20 is referred to herein as a barrier superlattice 20. The barrier superlattice 20 includes a number of superlattice (SL) barrier layers 22-1 through 22-N separated by superlattice (SL) well layers 24-1 through 24-(N-1). The superlattice barrier layers 22-1 through 22-N are high bandgap material layers formed in the Group IIa and IV-VI materials system and having a bandgap $E_{g,SLB}$. Preferably, the superlattice barrier layers 22-1 through 22-N are high bandgap $Pb_{(1-x-y)}Sr_xSn_ySe$ ($0<x<1$; $0<y<1$) material layers. The superlattice barrier layers 22-1 through 22-N may all be the same high bandgap material or two or more of the superlattice barrier layers 22-1 through 22-N may be different high bandgap materials in the Group IIa and IV-VI materials system.

The superlattice well layers 24-1 through 24-(N-1) are low bandgap material layers formed in the Group IIa and IV-VI materials system and having a bandgap $E_{g,SLW}$, where $E_{g,SLW} < E_{g,SLB}$. Preferably, the superlattice well layers 24-1 through 24-(N-1) are low bandgap $Pb_{(1-x'-y')}Sr_{x'}Sn_{y'}Se$ ($0<x'<1$; $0<y'<1$) material layers. The superlattice well layers 24-1 through 24-(N-1) may all be the same low bandgap material or two or more of the superlattice well layers 24-1 through 24-(N-1) may be different low bandgap materials in the Group IIa and IV-VI materials system. An effective, or combined, bandgap of the superlattice barrier layers 22-1 through 22-N and the superlattice well layers 24-1 through 24-(N-1) is the bandgap of the barrier layer 16-X, which as discussed above is greater than the bandgap of all adjacent well layer(s) in the heterostructure 12 for the thermoelectric material 10.

It should be noted that when referring to the barrier superlattice 20, the "high bandgap" material layers forming the superlattice barrier layers 22-1 through 22-N are material layers having bandgaps that are greater than bandgaps of the "low bandgap" material layers forming the adjacent superlattice well layers 24-1 through 24-(N-1). Likewise, the "high bandgap" material layers forming the superlattice well layers 24-1 through 24-(N-1) are material layers having bandgaps that are less than bandgaps of the "high bandgap" material layers forming the adjacent superlattice barrier layers 22-1 through 22-N.

In the barrier superlattice 20 of FIG. 3, a superlattice period thickness 26 of the barrier superlattice 20 is less than the tunneling probability length at a given operating temperature. Further, the superlattice barrier layers 22-1 through 22-N and the superlattice well layers 24-1 through 24-(N-1) are all of the same thickness such that the bandgaps of the superlattice barrier layers 22-1 through 22-N and the bandgaps of the superlattice well layers 24-1 through 24-(N-1) are constant over distance. The barrier superlattice 20 reduces thermal conductivity by phonon scattering at the interfaces between the superlattice barrier layers 22-1 through 22-N and the adjacent superlattice well layers 24-1 through 24-(N-1).

It should be noted that since the barrier superlattice 20 is the structure of the barrier layer 16-X, the barrier superlattice 20 is preferably terminated on both ends by superlattice barrier layers, namely, superlattice barrier layers 22-1 and 22-N. However, the barrier superlattice 20 is not limited thereto. For instance, the barrier superlattice 20 may alternatively be terminated by superlattice well layers or terminated at one end by a superlattice barrier layer and the other end by a superlattice well layer. If terminated by a superlattice well layer, the superlattice well layer preferably has a bandgap that is greater than a bandgap of the adjacent well layer in the heterostructure 12 of the thermoelectric material 10.

Figure 4:
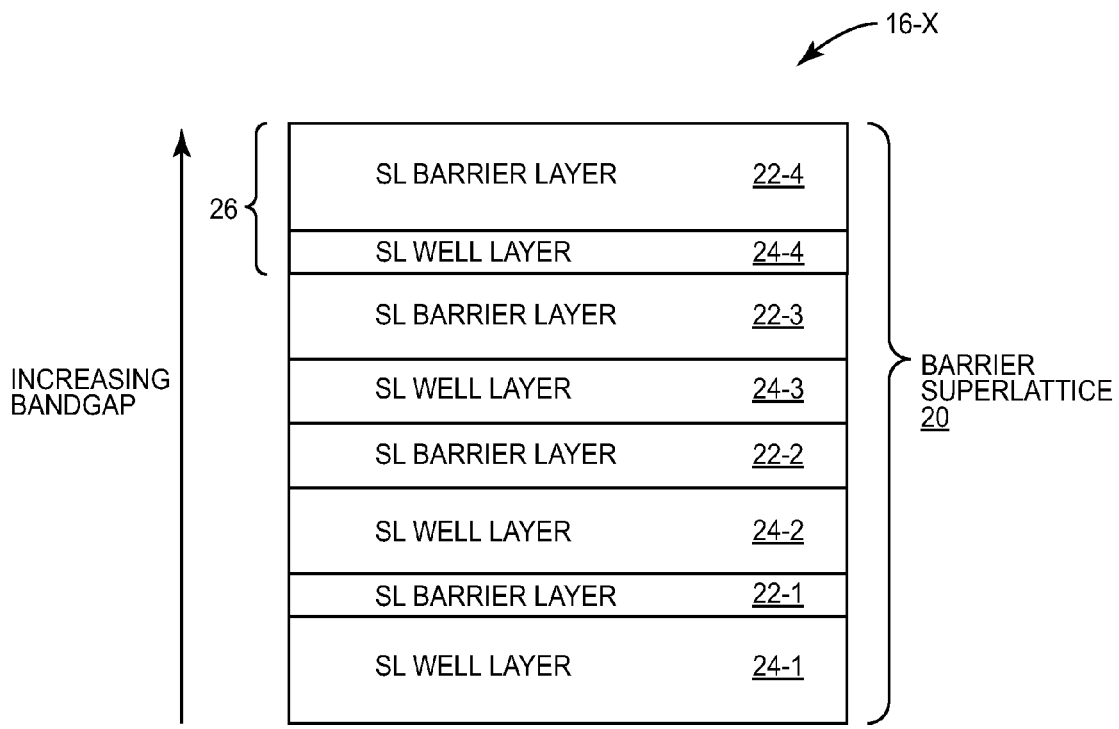
FIG. 4 illustrates an embodiment of a barrier layer for the thermoelectric material of FIGS. 1 and 2 where the barrier layer includes a short period superlattice according to another embodiment of the present disclosure.

FIG. 4 illustrates the barrier superlattice 20 according to another embodiment of the present disclosure. The barrier superlattice 20 of FIG. 4 is similar to that of FIG. 3. However, in this embodiment, the barrier superlattice 20 includes superlattice well layers 24-1 through 24-4 and superlattice barrier layers 22-1 through 22-4 arranged as shown where thicknesses of the superlattice barrier layers 22-1 through 22-4 and thicknesses of the superlattice well layers 24-1 through 24-4 are varied to create an energy grading across the barrier layer 16-X to increase cross-plane effective carrier density transport.

More specifically, the superlattice period thickness 26 is less than the tunneling probability length at a given operating temperature. As the thicknesses of the superlattice barrier layers 22-1 through 22-4 increase, the bandgap of the barrier superlattice 20 also increases.

In this example, the thicknesses of the superlattice barrier layers 22-1 through 22-4 linearly increase from one end of the barrier superlattice 20 to the other end of the barrier superlattice 20. As a result, the bandgap of the barrier superlattice 20 linearly increases in the same manner. Note that while the thicknesses of the superlattice barrier layers 22-1 through 22-4 and the superlattice well layers 24-1 through 24-4 are varied to provide a linear increase in the bandgap of the barrier superlattice 20 in the direction of carrier flow in this example, the thicknesses of the superlattice barrier layers 22-1 through 22-4 and the superlattice well layers 24-1 through 24-4 may be varied to increase the bandgap of the barrier superlattice 20 in any desired linear or non-linear manner (e.g., exponentially, step-wise, or the like).

Figure 5:
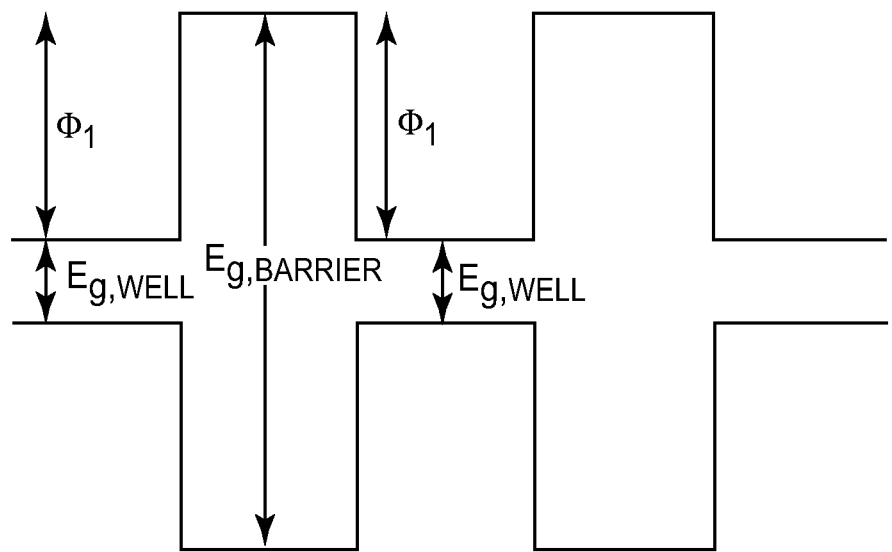
FIG. 5 is an energy band diagram for a barrier layer and adjacent well layers according to one embodiment of the present disclosure.

FIG. 5 is an energy band diagram for one of the barrier layers 16-X and the two adjacent well layers (referred to as well layers 14-X and 14-Y) of the heterostructure 12 of FIG. 2 according to one embodiment of the present disclosure. In this embodiment, the barrier layer 16-X is formed of one or more layers of the same high bandgap material in the Group IIa and IV-VI materials system or is a superlattice according to FIG. 3. As a result, the bandgap of the barrier layer 16-X ($E_{g,BARRIER}$) is constant across the thickness of the barrier layer 16-X. This energy band diagram is equally applicable to one embodiment of the heterostructure 12 of FIG. 1.

The well layers 14-X and 14-Y correspond to bandgap $E_{g,WELL}$, and the barrier layer 16-X corresponds to bandgap $E_{g,BARRIER}$. An effective barrier height or potential ($\phi$) at each interface between the barrier layer 16-X and the adjacent well layers 14-X and 14-Y is defined as the difference between the bandgap of the barrier layer 16-X ($E_{g,BARRIER}$) and the bandgap of the well layers 14-X and 14-Y ($E_{g,WELL}$) and can be adjusted by altering the alloy composition or the doping profile in the well and/or barrier layers 14-X, 14-Y, and 16-X. The barrier height ($\phi_1$) is chosen to promote one directional lateral carrier transport over the potential barrier. Preferably, the Fermi energy level with respect to the barrier layer conduction band is within $0.5k_BT$ to $1\ k_BT$ and is set by adjusting the alloy composition and doping level. In one non-limiting example, the well layers 14-X and 14-Y are formed of PbSe and the barrier layer 16-X is formed of $Pb_{0.92}Sr_{0.08}Se$. In this exemplary diagram, the barrier height ($\phi_1$) is constant with increasing distance. Typical barrier heights vary between 0.005 and 0.3 electron volts (eV) depending on the temperature of operation.

Figure 6:
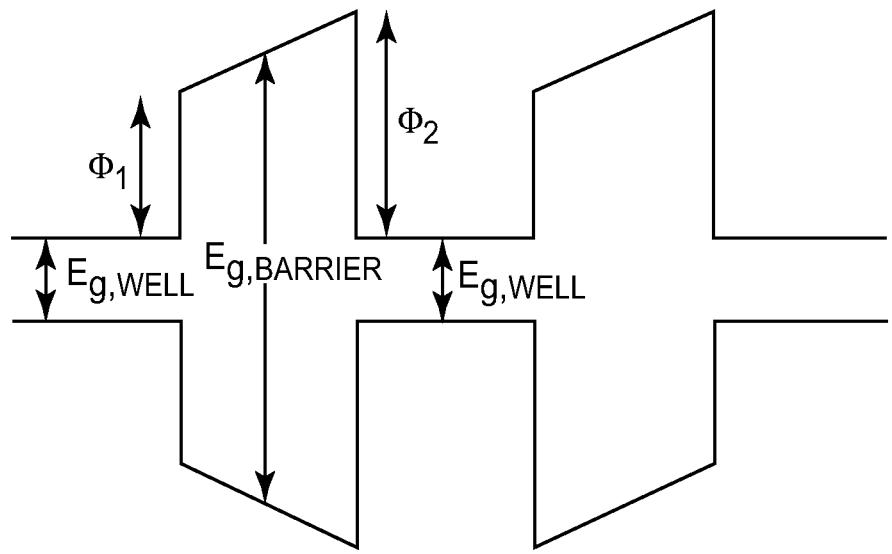
FIG. 6 is an energy band diagram for a barrier layer and adjacent well layers according to one exemplary embodiment where the barrier layer is formed by a short period superlattice that creates an increasing energy grading to increase cross-plane effective carrier density transport.

FIG. 6 is an energy band diagram for one of the barrier layers 16-X and the two adjacent well layers 14-X and 14-Y of the heterostructure 12 of FIG. 2 according to another embodiment of the present disclosure. In this embodiment, the barrier layer 16-X is a superlattice according to FIG. 4. As a result, the bandgap of the barrier layer 16-X ($E_{g,BARRIER}$)

increases across the thickness of the barrier layer 16-X in the desired direction of carrier flow.

The well layers 14-X and 14-Y correspond to bandgap $E_{g,WELL}$, and the barrier layer 16-X corresponds to bandgap $E_{g,BARRIER}$ that varies with distance across the barrier layer 16-X. More specifically, the bandgap of the barrier layer 16-X ($E_{g,BARRIER}$) increases in the desired direction of carrier flow. As a result, an effective barrier height or potential ($\phi_1$) at a first interface between the barrier layer 16-X and the adjacent well layer 14-X in the direction of carrier flow is less than an effective barrier height or potential ($\phi_2$) at a second interface between the barrier layer 16-X and the adjacent well layer 14-X in the direction of carrier flow. The barrier heights ($\phi_1$ and $100_2$) are chosen to promote lateral carrier transport over the potential barrier in the desired direction of carrier flow while discouraging lateral carrier transport over the potential barrier in the direction opposite to the desired direction of carrier flow. In one non-limiting example, the barrier layer 16-X may be formed of $Pb_{1-x}Sr_xSe$ with x varying from 8% to 13% across the barrier layer 16-X (Pb decreases accordingly as well).

Figure 7:
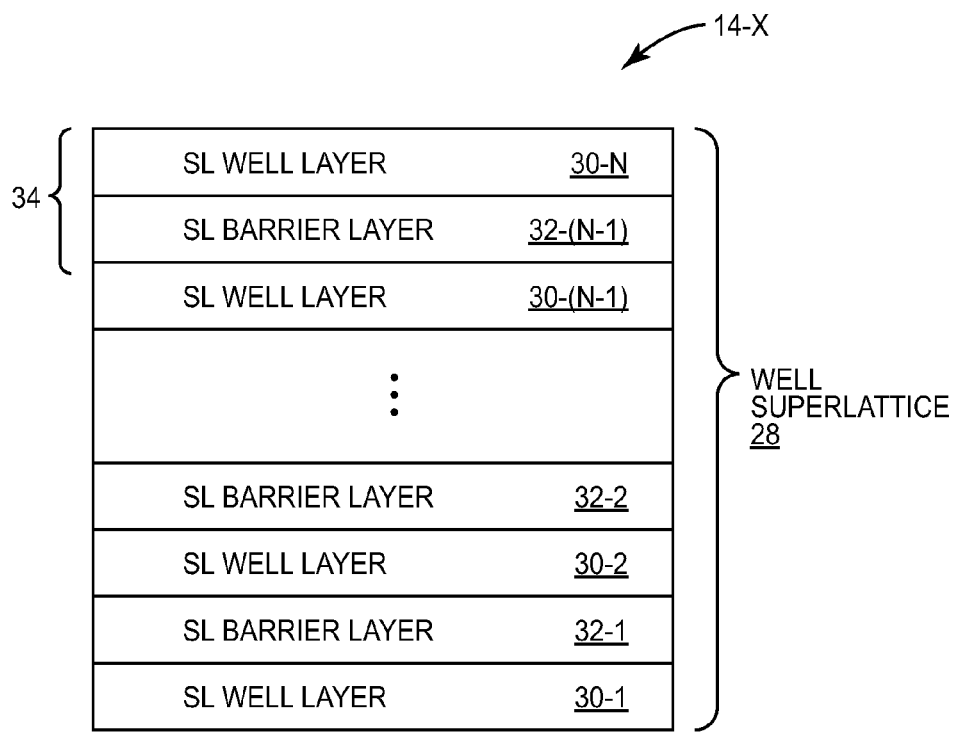
FIG. 7 illustrates an embodiment of a well layer for the thermoelectric material of FIGS. 1 and 2 where the well layer includes a short period superlattice according to one embodiment of the present disclosure.
Figure 8:
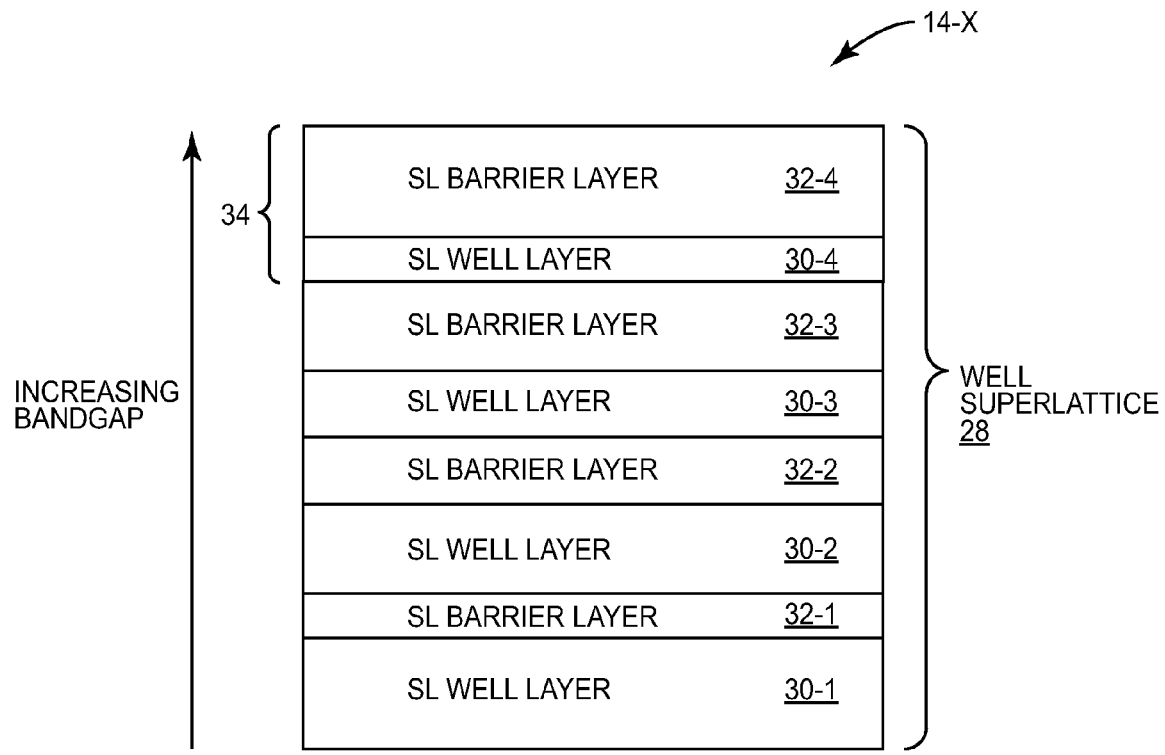
FIG. 8 illustrates an embodiment of a well layer for the thermoelectric material of FIGS. 1 and 2 where the well layer includes a short period superlattice according to another embodiment of the present disclosure.

FIGS. 7 and 8 are similar to FIGS. 3 and 4 and illustrate superlattice embodiments of one of the well layers 14-1 through 14-N. More specifically, FIG. 7 illustrates one of the well layers 14-1 through 14-N of FIG. 2 (hereinafter referred to as well layer 14-X), where the well layer 14-X is a short period superlattice 28 according to one embodiment of the present disclosure. Note that this discussion is equally applicable to the well layer 14 or 18 of FIG. 1. For convenience, the superlattice 28 is referred to herein as a well superlattice 28. The well superlattice 28 includes a number of superlattice (SL) well layers 30-1 through 30-N separated by superlattice (SL) barrier layers 32-1 through 32-(N-1). The superlattice well layers 30-1 through 30-N are low bandgap material layers formed in the Group IIa and IV-VI materials system and having a bandgap $E_{g,SLW}$. Preferably, the superlattice well layers 30-1 through 30-N are low bandgap $Pb_{(1-a-b)}Sr_aSn_bSe$ (0<a<1; 0<b<1) material layers. The superlattice well layers 30-1 through 30-N may all be the same low bandgap material or two or more of the superlattice well layers 30-1 through 30-N may be different low bandgap materials in the Group IIa and IV-VI materials system.

The superlattice barrier layers 32-1 through 32-(N-1) are high bandgap material layers formed in the Group IIa and IV-VI materials system and having a bandgap $E_{g,SLB}$, where $E_{g,SLW} < E_{g,SLB}$. Preferably, the superlattice barrier layers 32-1 through 32-(N-1) are high bandgap $Pb_{(1-a'-b')}Sr_{a'}Sn_{b'}Se$ (0<a'<1; 0<b'<1) material layers. The superlattice barrier layers 32-1 through 32-(N-1) may all be the same high bandgap material or two or more of the superlattice barrier layers 32-1 through 32-(N-1) may be different high bandgap materials in the Group IIa and IV-VI materials system. An effective, or combined, bandgap of the superlattice well layers 30-1 through 30-N and the superlattice barrier layers 32-1 through 32-(N-1) is the bandgap of the well layer 14-X, which as discussed above is less than the bandgap of all adjacent barrier layer(s) in the heterostructure 12 for the thermoelectric material 10.

It should be noted that when referring to the well superlattice 28, the "high bandgap" material layers forming the superlattice barrier layers 32-1 through 32-(N-1) are material layers having bandgaps that are greater than bandgaps of the "low bandgap" material layers forming the adjacent superlattice well layers 30-1 through 30-N. Likewise, the "high bandgap" material layers forming the superlattice well layers 30-1 through 30-N are material layers having bandgaps that are less than bandgaps of the "high bandgap" material layers forming the adjacent superlattice barrier layers 32-1 through 32-(N-1).

In the well superlattice 28 of FIG. 7, a superlattice period thickness 34 of the well superlattice 28 is less than the tunneling probability length at a given operating temperature. Further, the superlattice well layers 30-1 through 30-N and the superlattice barrier layers 32-1 through 32-(N-1) are all of the same thickness such that the bandgaps of the superlattice barrier layers 32-1 through 32-(N-1) and the bandgaps of the superlattice well layers 30-1 through 30-N are constant over distance. The well superlattice 28 reduces thermal conductivity by phonon scattering at the interfaces between the superlattice well layers 30-1 through 30-N and the adjacent superlattice barrier layers 32-1 through 32-(N-1).

It should be noted that since the well superlattice 28 is the structure of the well layer 14-X, the well superlattice 28 is preferably terminated on both ends by superlattice well layers, namely, superlattice well layers 30-1 and 30-N. However, the well superlattice 28 is not limited thereto. For instance, the well superlattice 28 may alternatively be terminated by superlattice barrier layers or terminated at one end by a superlattice barrier layer and the other end by a superlattice well layer. If terminated by a superlattice barrier layer, the superlattice barrier layer preferably has a bandgap that is less than a bandgap of the adjacent barrier layer in the heterostructure 12 of the thermoelectric material 10.

FIG. 8 illustrates the well superlattice 28 according to another embodiment of the present disclosure. The well superlattice 28 is similar to that of FIG. 7. However, in this embodiment, thicknesses of the superlattice barrier layers 32-1 through 32-4 and thicknesses of the superlattice well layers 30-1 through 30-4 are varied to create an energy grading across the well layer 14-X to increase cross-plane effective carrier density transport. More specifically, the superlattice period thickness 34 is less than the tunneling probability length at a given operating temperature. As the thicknesses of the superlattice barrier layers 32-1 through 32-4 increase, the bandgap of the well superlattice 28 also increases.

In this example, the thicknesses of the superlattice barrier layers 32-1 through 32-4 linearly increase from one end of the well superlattice 28 to the other end of the well superlattice 28. As a result, the bandgap of the well superlattice 28 linearly increases in the same manner. Note that while the thicknesses of the superlattice barrier layers 32-1 through 32-4 and the superlattice well layers 30-1 through 30-4 are varied to provide a linear increase in the bandgap of the well superlattice 28 in the direction of carrier flow in this example, the thicknesses of the superlattice barrier layers 32-1 through 32-4 and the superlattice well layers 30-1 through 30-3 may be varied to increase the bandgap of the well superlattice 28 in any desired linear or non-linear manner (e.g., exponentially, stepwise, or the like).

FIG. 9 is an energy band diagram for one of the well layers 14-X and the two adjacent barrier layers 16-X and 16-Y of the heterostructure 12 of FIG. 2 according to another embodiment of the present disclosure. In this embodiment, the well layer 14-X is a superlattice according to FIG. 8. As a result, the bandgap of the well layer 14-X ($E_{g,WELL}$) increases across the thickness of the well layer 14-X in the desired direction of carrier flow.

The barrier layers 16-X and 16-Y correspond to bandgap $E_{g,BARRIER}$, and the well layer 14-X corresponds to bandgap $E_{g,WELL}$ that varies with distance across the well layer 14-X. More specifically, the bandgap of the well layer 14-X ($E_{g,WELL}$) increases in the desired direction of carrier flow. As a result, an effective barrier height or potential ($\phi_1$) at a first interface between the well layer 14-X and the adjacent barrier layer 16-X in the direction of carrier flow is greater than an effective barrier height or potential ($\phi_2$) at a second interface between the well layer 14-X and the adjacent barrier layer 16-Y in the direction of carrier flow. The barrier heights ($\phi_1$ and $\phi_2$) are chosen to promote lateral carrier transport over the potential barrier in the desired direction of carrier flow while discouraging lateral carrier transport over the potential barrier in the direction opposite to the desired direction of carrier flow.

FIG. 10 is an energy band diagram of a series of adjacent well and barrier layers 14 and 16 in the heterostructure 12 of FIG. 2 according to yet another embodiment of the present disclosure. In this embodiment, both the barrier layers 16 and the well layers 14 are formed as superlattices as described above with respect to FIGS. 4 and 8, respectively. Again, the barrier heights are chosen to promote lateral carrier transport over the potential barrier in the desired direction of carrier flow while discouraging lateral carrier transport over the potential barrier in the direction opposite to the desired direction of carrier flow.

While the embodiments of the thermoelectric material 10 described herein have numerous advantages, some non-limiting examples are:

1. Embodiments that use PbSe-based materials:
    a. have intrinsically low thermal conductivity compared to other material systems that is stable throughout a wide range of doping from n-type to p-type materials,
    b. have near equal band conduction and valence band offsets-n-type and p-type material have similar transport properties, and
    c. are mechanically much softer than Group III-V, Group II-VI, and Group IV bonded counterparts resulting in higher tolerance to lattice strain and thermal expansion mismatch;
2. Heterostructure design to increase carrier transport. The hot carrier transport increases the ZT compared to bulk materials;
3. Embodiments where well and/or barrier layers 14 and 16 are constructed from short period superlattices to reduce thermal conductivity by phonon scattering at the interfaces; and
4. Embodiments having highly doped well and/or barrier layers reduce thermal conductivity through electron-phonon scattering mechanisms.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

Those skilled in the art will recognize improvements and modifications to the preferred embodiments of the present disclosure. All such improvements and modifications are considered within the scope of the concepts disclosed herein and the claims that follow.

What is claimed is:

1. A thin-film thermoelectric material comprising:
   a heterostructure formed in a Group IIa and IV-VI materials system, the heterostructure comprising a plurality of barrier layers separated by a plurality of well layers such that the plurality of barrier layers and the plurality of well layers form an alternating series of barrier and well layers;

wherein:
   each well layer of the plurality of well layers comprises one or more layers of a first material in the Group IIa and IV-VI materials system, and each barrier layer of the plurality of barrier layers comprises one or more layers of a second material in the Group IIa and IV-VI materials system having a bandgap that is greater than that of the first material in the Group IIa and IV-VI materials system of all adjacent well layers in the heterostructure; and
   the first material in the Group IIa and IV-VI materials system of each of the plurality of well layers is a first Lead Strontium Tin Selenide material, and the second material in the Group IIa and IV-VI materials system of each of the plurality of barrier layers is a second Lead Strontium Tin Selenide material having a bandgap that is greater than that of the first Lead Strontium Tin Selenide material of all adjacent well layers in the heterostructure.

2. The thin-film thermoelectric material of claim 1 wherein all barrier layers of the plurality of barrier layers comprise one or more layers of the same Lead Strontium Tin Selenide material.

3. The thin-film thermoelectric material of claim 1 wherein at least two barrier layers of the plurality of barrier layers comprise different Lead Strontium Tin Selenide materials.

4. The thin-film thermoelectric material of claim 1 wherein all well layers of the plurality of well layers comprise one or more layers of the same Lead Strontium Tin Selenide material.

5. The thin-film thermoelectric material of claim 1 wherein at least two well layers of the plurality of well layers comprise different Lead Strontium Tin Selenide materials.

6. A thin-film thermoelectric material comprising:
   a heterostructure formed in a Group IIa and IV-VI materials system, the heterostructure comprising a plurality of barrier layers separated by a plurality of well layers such that the plurality of barrier layers and the plurality of well layers form an alternating series of barrier and well layers;

wherein:
   at least one barrier layer of the plurality of barrier layers comprises a short period superlattice formed in the Group IIa and IV-VI materials system, the short period superlattice comprising a plurality of superlattice barrier layers separated by a plurality of superlattice well layers such that the plurality of superlattice barrier layers and the plurality of superlattice well layers form an alternating series of superlattice barrier and superlattice well layers;
   each superlattice well layer of the plurality of superlattice well layers comprises one or more layers of a first material in the Group IIa and IV-VI materials system, and each superlattice barrier layer of the plurality of superlattice barrier layers comprises one or more layers of a second material in the Group IIa and IV-VI materials system having a bandgap that is greater than a bandgap of the first material in the Group IIa and IV-VI materials system of all adjacent superlattice well layers in the short period superlattice; and
   for each superlattice well layer of the plurality of superlattice well layers the first material in the Group IIa and IV-VI materials system is a first Lead Strontium Tin Selenide material, and for each superlattice barrier layer of the plurality of superlattice barrier layers the second material in the Group IIa and IV-VI materials system is a second Lead Strontium Tin Selenide material having a bandgap that is greater than a bandgap of the first Lead Strontium Tin Selenide material of all adjacent superlattice well layers in the short period superlattice.

7. The thin-film thermoelectric material of claim 6 wherein all superlattice barrier layers of the plurality of superlattice barrier layers comprise one or more layers of the same Lead Strontium Tin Selenide material.

8. The thin-film thermoelectric material of claim 6 wherein at least two superlattice barrier layers of the plurality of superlattice barrier layers comprise different Lead Strontium Tin Selenide materials.

9. The thin-film thermoelectric material of claim 6 wherein all superlattice well layers of the plurality of superlattice well layers comprise one or more layers of the same Lead Strontium Tin Selenide material.

10. The thin-film thermoelectric material of claim 6 wherein at least two superlattice well layers of the plurality of superlattice well layers comprise different Lead Strontium Tin Selenide materials.

11. A thin-film thermoelectric material comprising:
   a heterostructure formed in a Group IIa and IV-VI materials system, the heterostructure comprising a plurality of barrier layers separated by a plurality of well layers such that the plurality of barrier layers and the plurality of well layers form an alternating series of barrier and well layers;
   wherein:
      at least one well layer of the plurality of well layers comprises a short period superlattice formed in the Group IIa and IV-VI materials system, the short period superlattice comprising a plurality of superlattice barrier layers separated by a plurality of superlattice well layers such that the plurality of superlattice barrier layers and the plurality of superlattice well layers form an alternating series of superlattice barrier and superlattice well layers;
      each superlattice well layer of the plurality of superlattice well layers comprises one or more layers of a first material in the Group IIa and IV-VI materials system, and each superlattice barrier layer of the plurality of superlattice barrier layers comprises one or more layers of a second material in the Group IIa and IV-VI materials system having a bandgap that is greater than a bandgap of the first material in the Group IIa and IV-VI materials system of all adjacent superlattice well layers in the short period superlattice; and
      for each superlattice well layer of the plurality of superlattice well layers the first material in the Group IIa and IV-VI materials system is a first Lead Strontium Tin Selenide material, and for each superlattice barrier layer of the plurality of superlattice barrier layers the second material in the Group IIa and IV-VI materials system is a second Lead Strontium Tin Selenide material.

12. The thin-film thermoelectric material of claim 11 wherein all superlattice barrier layers of the plurality of superlattice barrier layers comprise one or more layers of the same Lead Strontium Tin Selenide material.

13. The thin-film thermoelectric material of claim 11 wherein at least two superlattice barrier layers of the plurality of superlattice barrier layers comprise different Lead Strontium Tin Selenide materials.

14. The thin-film thermoelectric material of claim 11 wherein all superlattice well layers of the plurality of superlattice well layers comprise one or more layers of the same Lead Strontium Tin Selenide material.

15. The thin-film thermoelectric material of claim 11 wherein at least two superlattice well layers of the plurality of superlattice well layers comprise different Lead Strontium Tin Selenide materials.

* * * * *